United States Patent
Gronenborn et al.

(10) Patent No.: US 11,171,468 B2
(45) Date of Patent: Nov. 9, 2021

(54) LASER ARRANGEMENT WITH IRREGULAR EMISSION PATTERN

(71) Applicant: TRUMPF Photonic Components GmbH, Ulm (DE)

(72) Inventors: Stephan Gronenborn, Ulm (DE); Holger Joachim Moench, Ulm (DE); Ralph Engelbertus Theodorus Gudde, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 0 days.

(21) Appl. No.: 16/936,509

(22) Filed: Jul. 23, 2020

(65) Prior Publication Data
US 2020/0358257 A1  Nov. 12, 2020

Related U.S. Application Data

(63) Continuation of application No. PCT/EP2019/051703, filed on Jan. 24, 2019.

(30) Foreign Application Priority Data

Jan. 24, 2018  (EP) .................................... 18153119

(51) Int. Cl.
*H01S 5/42* (2006.01)
*H01S 5/02255* (2021.01)
(Continued)

(52) U.S. Cl.
CPC ............ *H01S 5/423* (2013.01); *H01S 5/0207* (2013.01); *H01S 5/0261* (2013.01);
(Continued)

(58) Field of Classification Search
CPC .... H01S 5/423; H01S 5/0207; H01S 5/18305; H01S 5/0261; H01S 5/02255; H01S 5/02257; H01S 5/183; H01S 5/4012
See application file for complete search history.

(56) References Cited

U.S. PATENT DOCUMENTS

| | | |
|---|---|---|
| 2007/0071056 A1 | 3/2007 | Ye |
| 2012/0293625 A1 | 11/2012 | Stephan et al. |

(Continued)

FOREIGN PATENT DOCUMENTS

WO  WO 2013127974 A1  9/2013

*Primary Examiner* — Yuanda Zhang
(74) *Attorney, Agent, or Firm* — Leydig, Voit & Mayer, Ltd.

(57) ABSTRACT

A laser arrangement includes a laser array including a multitude of lasers and an optical device configured to provide a defined illumination pattern in a defined field-of-view. The optical device includes a multitude of localized optical structures, each respective localized optical structure being associated with at least one respective laser of the laser array and being arranged to redirect laser light emitted by the at least one respective laser such that laser light emitted by the at least one respective laser appears to be emitted from at least one apparent position of the laser array. The localized optical structures are arranged such that laser light emitted by at least one respective selected laser appears to be emitted from at least two apparent positions of the laser array. The optical device is arranged such that the apparent positions are distributed in an irregular pattern.

16 Claims, 7 Drawing Sheets

(51) Int. Cl.
*H01S 5/183* (2006.01)
*H01S 5/40* (2006.01)
*H01S 5/02257* (2021.01)
*H01S 5/026* (2006.01)
*H01S 5/02* (2006.01)

(52) U.S. Cl.
CPC ...... *H01S 5/02255* (2021.01); *H01S 5/02257* (2021.01); *H01S 5/183* (2013.01); *H01S 5/18305* (2013.01); *H01S 5/4012* (2013.01)

(56) References Cited

U.S. PATENT DOCUMENTS

| | | |
|---|---|---|
| 2015/0340841 A1 | 11/2015 | Joseph |
| 2016/0072258 A1 | 3/2016 | Tong et al. |
| 2016/0164261 A1 | 6/2016 | Warren |
| 2017/0153319 A1* | 6/2017 | Villeneuve .......... H01S 3/08086 |
| 2019/0249984 A1* | 8/2019 | Barlev ................ G02B 27/425 |
| 2020/0028329 A1* | 1/2020 | Gronenborn ............ H01S 5/026 |

* cited by examiner

LASER ARRANGEMENT WITH IRREGULAR EMISSION PATTERN

CROSS REFERENCE TO RELATED APPLICATIONS

This application is a continuation of International Patent Application No. PCT/EP2019/051703, filed on Jan. 24, 2019, which claims priority to European Patent Application No. EP 18153119.5, filed on Jan. 24, 2018. The entire disclosure of both applications is hereby incorporated by reference herein.

FIELD

The invention relates to a laser arrangement, a lighting device comprising such a laser arrangement, a camera, an optical key comprising such a lighting device, and a method of manufacturing the laser arrangement.

BACKGROUND

US 2016/0072258 A1 discloses a structured light source comprising VCSEL arrays which are configured to project a structured illumination pattern into a region for three dimensional imaging and gesture recognition applications.

US 2007/0071056 A1 discloses laser ranging and detection by sequentially emitting a plurality of beams from a VCSEL structure, re-directing the beams through optical elements such that they are fanned out over the region of view, and detecting any beams that may be reflected by objects in the region of view.

US 2016/0164261 A1 discloses methods, devices and systems for selectively illuminating different zones of a field of view by a multi-zone illumination device.

US 2015/0340841 A1 discloses a VCSEL array device, wherein the VCSELs may be separated into subarrays and each VCSEL may be covered with an integrated or bonded micro-lens for directing beams of light without external lenses.

WO 2013/127974 A1 discloses an apparatus for generating spatially coded structured light generated by an array of laser diodes in order to perform structured light triangulation. The position of individual laser diodes in the array is coded spatially to form a non-regular unique pattern. The light output by the lasers is projected by a refractive or diffractive optical system into the space to be monitored to form the structured light pattern.

US 2012/0293625 A1 discloses a 3D camera having at least one illumination unit which comprises a light source and which is configured for generating an irregular illumination pattern in an illumination area of the 3D camera. The light source comprises a semiconductor array having a plurality of individual emitter elements in an irregular arrangement, and a refractive individual emitter element generates a pattern element of the irregular illumination pattern.

SUMMARY OF THE INVENTION

According to an embodiment, the present invention provides a laser arrangement that includes a laser array including a multitude of lasers and an optical device configured to provide a defined illumination pattern in a defined field-of-view. The optical device includes a multitude of localized optical structures, each respective localized optical structure being associated with at least one respective laser of the laser array and being arranged to redirect laser light emitted by the at least one respective laser such that laser light emitted by the at least one respective laser appears to be emitted from at least one apparent position of the laser array. The localized optical structures are arranged such that laser light emitted by at least one respective selected laser appears to be emitted from at least two apparent positions of the laser array. The optical device is arranged such that the apparent positions are distributed in an irregular pattern.

The present disclosure describes laser arrangements that enable flexible and cost-effective applications of structured light patterns.

According to a first aspect, a laser arrangement is provided. The laser arrangement comprises a laser array and an optical device for providing a defined illumination pattern in a defined field-of-view. The optical device comprises a multitude of localized optical structures. The multitude of localized optical structures may be arranged in a plane of the optical device. Each localized optical structure is associated with at least one laser. Each localized optical structure is arranged to redirect laser light emitted by at least one laser comprised by the laser array such that the laser light emitted by each laser appears to be emitted from at least one apparent position of the laser array. The localized optical structures are arranged such that the laser light emitted by at least one of the lasers appears to be emitted from at least two apparent positions of the laser array. The optical device is arranged such that the at least one apparent positions are distributed in an irregular pattern.

Irregular pattern means that the apparent positions are distributed in a random or pseudo-random pattern. The defined illumination pattern in the field of view (e.g. 50°× 70° or 80°×100°) is therefore also an irregular illumination pattern. The apparent positions in a plane of the laser array are usually shifted (more than 80%, more preferably more than 90% are preferably shifted) by means of the optical device with respect to the physical position of the lasers in the plane of the laser array. The laser array may, for example, comprise lasers which are arranged in a regular pattern (quadratic, rectangular, hexagonal etc. pattern). The optical device redirects laser light of nearly all of the lasers such that the laser light appears to be emitted by a virtual or apparent position, wherein the apparent positions are usually distributed in a random fashion around the physical position of the laser emitting the respective laser light. There may be rare cases in which the physical position is identical with the apparent position. A localized optical structure may be associated with two, three or more lasers. The size of the localized optical structures may be in the range of the size of an area in a reference plane in which the localized optical structures are arranged which is illuminated by one laser (emission cone of a laser with full width half maximum intensity). The size of the localized optical structures with respect to the reference plane may (or the area occupied by the localized optical structure in the reference plane), for example, be in the range between 100 $\mu m^2$ and 2500 $\mu m^2$, preferably in the range between 200 $\mu m^2$ and 2000 $\mu m^2$ and most preferably in the range between 300 $\mu m^2$ and 1600 $\mu m^2$.

The combination of the laser array with the optical device comprising the localized optical structures does have the advantage that the boundary conditions with respect to the distribution of the apparent positions is not bound by the strict boundary conditions of arranging and contacting lasers in a laser array. The latter is especially valid in view of the boundary conditions imposed by the processing of Vertical Cavity Surface Emitting Laser (VCSEL). There is, for example, a minimum distance between two mesas defined by the oxide width, fabrication tolerances etc. Furthermore, the distance between two mesas should not be too large as this would be a waste of valuable wafer (GaAs) area. A new pattern of VCSELs on a common substrate requires a new mask set and a new VCSEL processing having different distances between mesas. Depending on the level of quality requirements this imposes the need for careful testing and re-qualification of the devices. For security applications it may, for example, be interesting to have a very large number of different i.e. unique dot patterns. It is not practical to have millions of different patterns made by detailed lithographic masks.

The lasers may be arranged in an irregular pattern. The optical device with the multitude of localized optical structures is arranged such that each relative movement or a displacement perpendicular to the laser light emitted by the lasers in the order of the (average) pitch between the lasers results in case of an irregular pattern of lasers in a different irregular pattern. The optical device with the multitude of localized optical structures thus differentiates from a, for example, conventional diffractive optical element which will always provide the same the pattern because such a conventional diffractive optical element is invariant with respect to transversal displacements. The combination of the optical device with the irregular pattern of lasers therefore enables a multitude of different irregular patterns by a simple relative shift in the order of the average pitch between neighboring mesas or lasers. It is thus not necessary to provide a number of different laser designs and/or optical designs. It may therefore be possible to generate a multitude (millions) of different patterns by combining the same irregular laser array with the same optical device but providing lateral shifts between both of them (longitudinal shifts, rotational shifts etc.).

The laser light emitted by the lasers may be characterized by an emission cone as discussed above. The emission cones of the laser light may overlap before being redirected by optical device. At least a part of the lasers may in this case be associated with at least two localized optical structures. One laser may be arranged to emit laser light to two, three or more localized optical structures. There may be two, three or more apparent positions of the respective lasers, each apparent position results from the interaction between the laser light and the respective localized optical structure. The combination of the laser array and optical element may therefore be used to increase the apparent number of lasers. A disadvantage of this approach may be that the intensity of the apparent lasers depends on the number of apparent lasers associated to one real laser and the light received by one localized optical structure from one laser.

Each localized optical structure may therefore alternatively be associated with exactly one laser. The intensity of the irregular illumination pattern may in this case be more homogeneous in comparison to the embodiment discussed above.

The optical device may be arranged such that apparent positions of different lasers overlap. Laser light of two or more lasers appear in this case to be emitted from the same apparent position or spot. The positions of these spots are again randomized in lateral dimensions. The advantage of this approach may be a redundancy and a significant reduction of single pixel failure rate. The power per spot can be increased if two, three or more lasers contribute to one spot.

The lasers may be VCSELs arranged on a common semiconductor substrate. The common semiconductor substrate comprises a first side and a second side opposite to the first side. The VCSELs are arranged on the first side of the semiconductor substrate.

The second side of the semiconductor substrate may be structured (e.g. by etching the semiconductor material of the semiconductor substrate). The optical device may comprise the structured second side of the semiconductor substrate. The structured second side of the semiconductor substrate comprises the localized optical structures. The optical device may consist of the structured second side of the semiconductor substrate. The VCSELs are in this case bottom emitters emitting the laser light through or in the direction of the semiconductor substrate.

The optical device may alternatively comprise a material which is deposited on the first or the second side of the semiconductor substrate. The material is transparent in the wavelength range of the emission wavelength of the VCSELs. The material is preferably provided on wafer level before separating the laser arrays (dicing chips). The surface of the material which is pointing away from the respective (first or second) side of the semiconductor substrate is structured (e.g. by optical or mechanical methods) to get the localized optical structures.

The optical device may be a refractive optical device. The localized optical structures are in this embodiment refractive optical structures. Manufacturing of the refractive optical device may be very simple and optical losses may be smaller in comparison to a diffractive optical device.

The refractive optical structures may be surfaces which are inclined with respect to a plane comprising light emission surfaces of the lasers (or any other reference plane parallel to the plane of the laser array). The inclined surfaces are arranged to redirect the laser light emitted by the different lasers in different directions. The optical device is in this embodiment an array of e.g. tilted facets or microprisms which redirect or tilt the beam of each laser individually, such that the apparent positions are shifted with respect to the real laser positions. A lateral and randomized shift of each apparent position of the lasers is enabled by the localized refractive optical structures. This is especially simple if the tilted facets are made by means of a lithographic process but as well possible for replication molding with a more complex master. Preferably but not necessarily the optical device is made by wafer level optics e.g. replication molding in a polymer layer on top of the laser or by etching the optical structure into the GaAs substrate backside in case of a bottom emitting array as described above. The plane of the laser sources (e.g. VCSELs) and the apparent sources is then imaged to the scene by a projection optic to enable the random dot pattern on the scene in the field of view. The random dot pattern may be measured by a (3D) camera using the structured light pattern to determine the distance for the different parts of the image.

The optical device may alternatively be a diffractive optical device. The localized optical structures are in this embodiment diffractive optical structures. The diffractive optical structures may, for example, comprise local grating structures. The local grating structures are arranged to redirect the laser light emitted by the different lasers in different directions. The diffractive optical element may also split the beam of the laser to at least two beams with different displacement of the apparent positions. This displacement is different for the localized structures within the optical element (at least two different displacement patterns, preferably a different displacement pattern for each localized structure).

According to a further aspect a light emitting device is provided. The light emitting device comprises at least one laser arrangement according to any embodiment described above and an electrical driver for providing an electrical drive current to the laser arrangement.

According to a further aspect an optical key is provided. The optical key comprises the light emitting device described above and optionally a local energy source like a battery or the like. The optical key preferably comprises a VCSEL array wherein the VCSELs are arranged in an irregular pattern as described above and the optical device. The combination of the irregular VCSEL array with the optical device enables millions of different irregular illumination patterns by simple translations or rotations between the VCSEL array and the optical device as described above. A glass or plastic wafer may, for example, comprise a multitude of optical devices. The wafer with the optical devices may be coupled (e.g. glued) to the wafer comprising the VCSEL arrays. The coupling process may be performed in a random fashion or there may be defined movement (translations or rotations) between the semiconductor wafer and the optical wafer. The wafer arrangement may subsequently be separated by a dicing process to get a multitude of laser arrangements with different illumination pattern. The illumination pattern can be used to identify the optical key comprising the respective laser arrangement. Such highly randomized devices are essentially unique and could be used as a security means. As VCSEL fabrication is not available easily the threshold to make a fake copy of such key is higher than for most other methods. Furthermore, it may nearly be impossible to reconstruct the correct optical coupling between random VCSEL or laser array and random optical device.

The laser array comprised by the laser arrangement and the optical key may comprise laser sub-arrays. The laser sub-arrays are arranged to be electrically driven independently by means of the electrical driver. The electrically driver is arranged to switch the laser sub-arrays on and off in accordance with a predefined switching sequence. An optical key comprising such a switchable laser array or laser arrangement allows combining the essentially unique lighting pattern which can be emitted by means of the laser arrangement with a predefined switching sequence. The predefined switching sequence may be different for each optical key. The optical key may, for example, comprise an interface to interact with the electrical driver to generate the predefined switching sequence. The optical key may, for example, comprise a sensor which is arranged to detect a fingerprint or a pattern of blood veins in the skin. The predefined pattern may be determined based on characteristics of the fingerprint or the pattern of blood veins.

According to a further aspect, a (3D) camera is provided. The camera comprises the light emitting device according to any embodiment described above, an evaluator and a light detector. The light detector is arranged to detect laser light reflected by an object. The evaluator is arranged to determine a distance to the object by means of the reflected laser light detected by the light detector. The multitude of distances which are determined based on the structured light pattern may be used to reconstruct a 3D image of the object. The camera may be used for gesture recognition.

According to a further aspect, a method of fabricating a laser arrangement according to any embodiment described above is provided. The method comprises the steps of: providing a laser array comprising a multitude of lasers, providing an optical device, wherein the optical device comprises a multitude of localized optical structures arranged in a plane of the optical device, associating each localized optical structure with at least one laser, and arranging the localized optical structures to redirect laser light emitted by the lasers such that the laser light emitted by each laser appears to be emitted from at least one apparent position of the laser array, wherein the at least one apparent positions are distributed in an irregular pattern.

The method steps are not necessarily performed in the sequence described above. The method may comprise the further steps of providing a semiconductor substrate and providing the multitude of lasers on a first side of the semiconductor substrate. The method may comprise the step of removing the substrate after processing the lasers.

It shall be understood that the laser arrangement described above and the method of fabricating may have similar and/or identical embodiments.

Further advantageous embodiments are defined below.

BRIEF DESCRIPTION OF THE DRAWINGS

Embodiments will be described below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Various embodiments will now be described by in the context of the Figures. In the Figures, like numbers refer to like objects throughout. Objects in the Figures are not necessarily drawn to scale.

Figure 1:
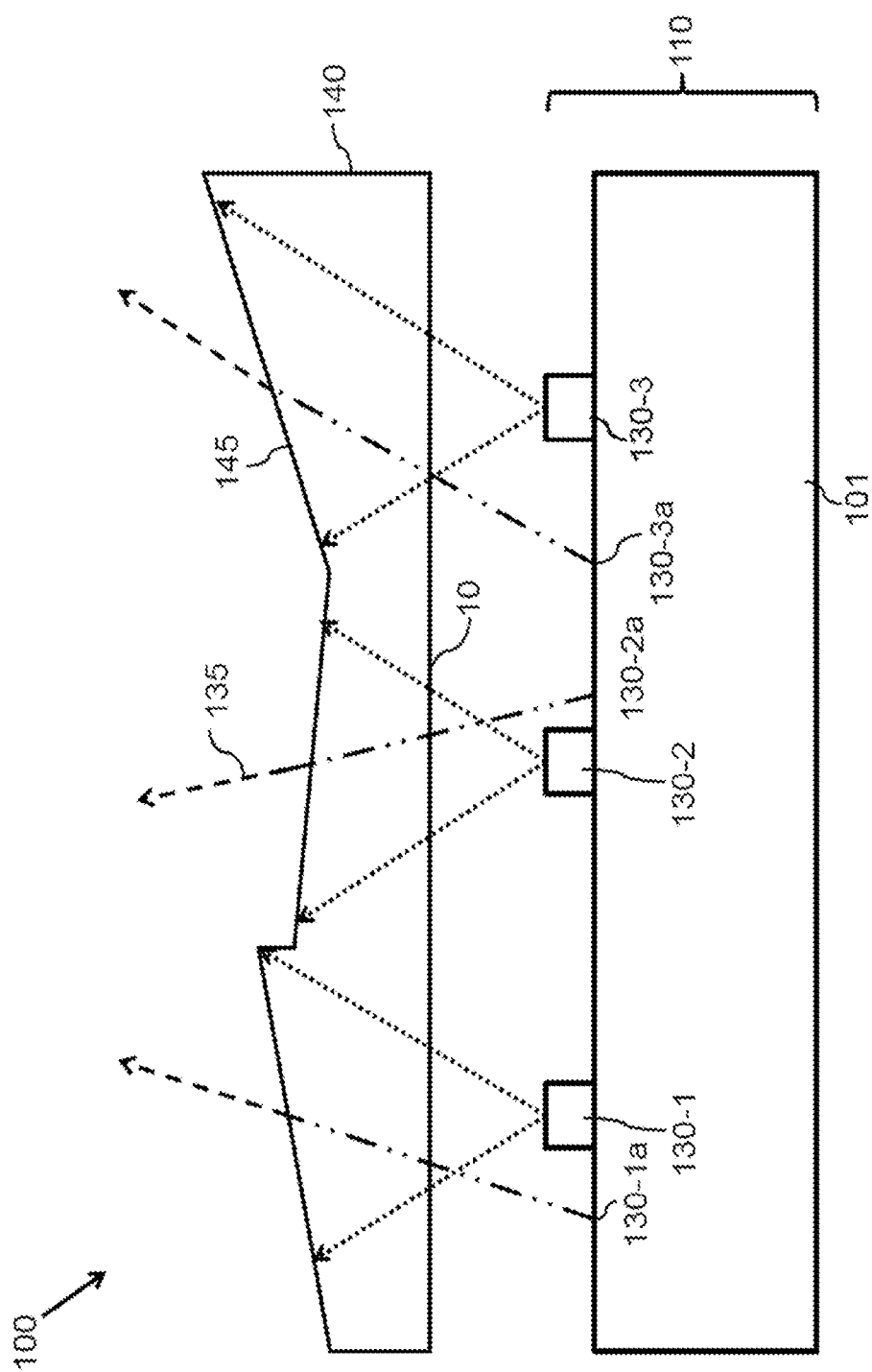
FIG. 1 shows a principal sketch of a cross-section of a first laser arrangement.

FIG. 1 shows a principal sketch of a cross-section of a first laser arrangement 100. The first laser arrangement comprises a two-dimensional laser array 110. The laser array 110 comprises a multitude of lasers 130-1, 130-2, 130-3. The lasers 130-1, 130-2, 130-3 are VCSELs. The VCSELs are arranged in a regular periodic pattern (quadratic pattern with same pitch between neighboring VCSELs in the plane of the laser array 110 on a common substrate 101). Side-emitting lasers may, for example, be used in alternative embodiment. Each VCSEL emits laser light 10 with a defined emission cone as indicated in the drawing to an optical device 140. The optical device 140 comprises localized optical structures 145. The localized optical structures 145 comprise surfaces which are tilted or inclined with respect to a surface normal to a plane parallel to the laser array 140. FIG. 1 shows only a tilt in one direction. The tilted or inclined surfaces may be arranged such that there is a tilt angle in both directions (x-direction and y-direction) of the laser array 110. The tilt angles are distributed in an irregular (random or pseudo-random) pattern. The laser light 10 is locally refracted in accordance with the respective tilt angle(s) such that redirected laser light 135 is emitted by the laser arrangement 100. The redirected laser light 135 appears to be emitted from apparent positions 130-1a, 130-2a, 130-3a on the substrate 101 of the laser array 110. The optical device 140 is in this embodiment a refractive optical device. The optical shifts of the apparent positions 130-1a, 130-2a, 130-3a are therefore not limited by the narrow VCSEL design limitations. The packing density of the VCSEL array can be maximized to save gallium arsenide wafer area. The optical device 140 may in this embodiment consist of plastic material which is integrated with the array 110 in a common package. The localized optical structures 145 (inclined surfaces) may alternatively be arranged on a side of the optical device 140 which is arranged next to the light-emitting surfaces of the VCSELs.

Figure 2:
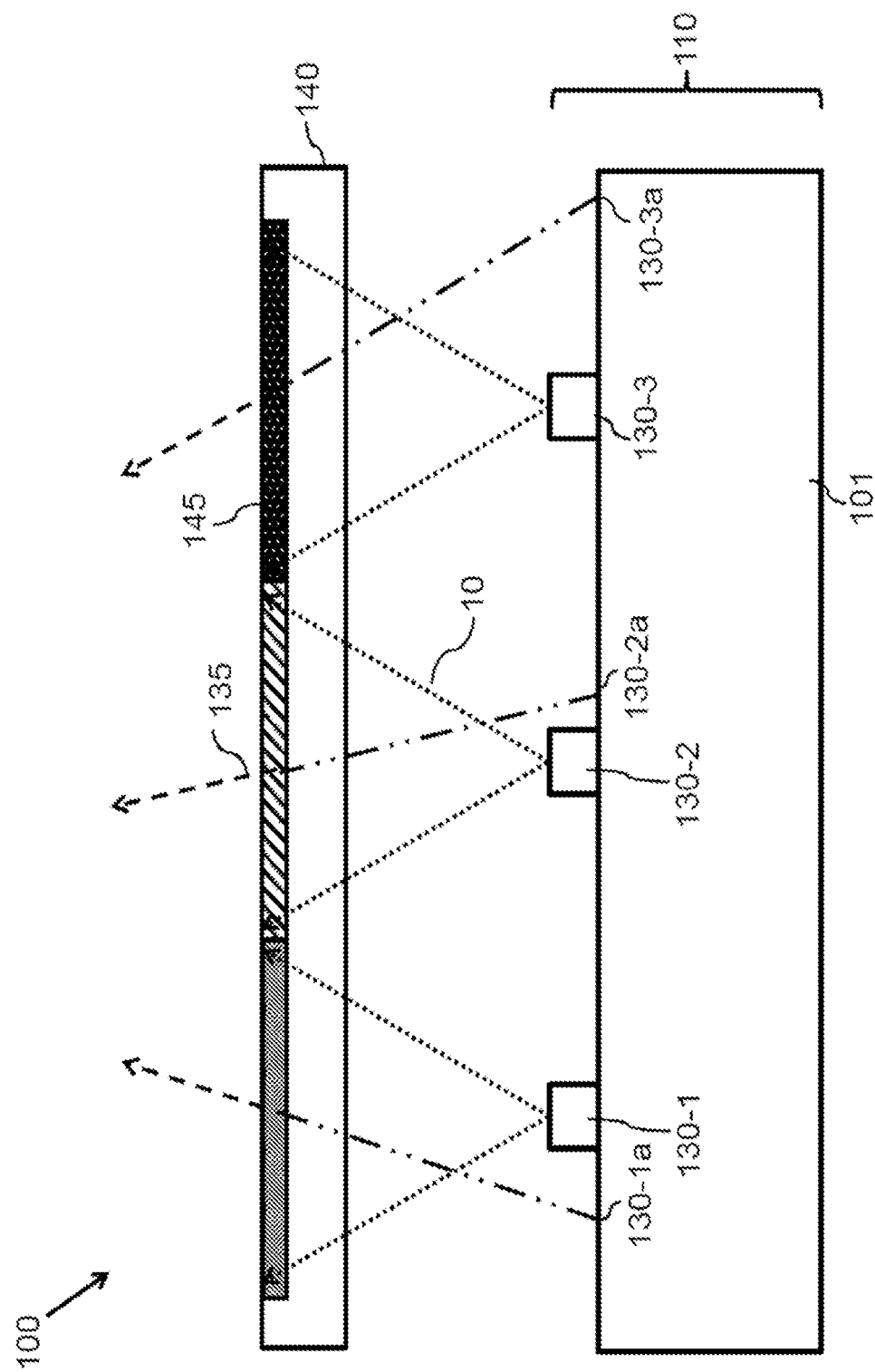
FIG. 2 shows a principal sketch of a cross-section of a second laser arrangement.

FIG. 2 shows a principal sketch of a cross-section of a second laser arrangement 100. The general configuration is very similar as discussed with respect to FIG. 1. The essential difference is that the optical device 140 is in this embodiment a diffractive optical device. The diffractive optical device comprises localized optical structures 145 which are in this embodiment local gratings arranged to redirect the laser light 10 in different directions similar as discussed with respect to FIG. 1. The optical device 140 consists of a sheet of glass in which on one side the local gratings are etched. Each VCSEL in the embodiments described with respect to FIG. 1 and FIG. 2 is associated with only one local optical structure 145.

Figure 3:
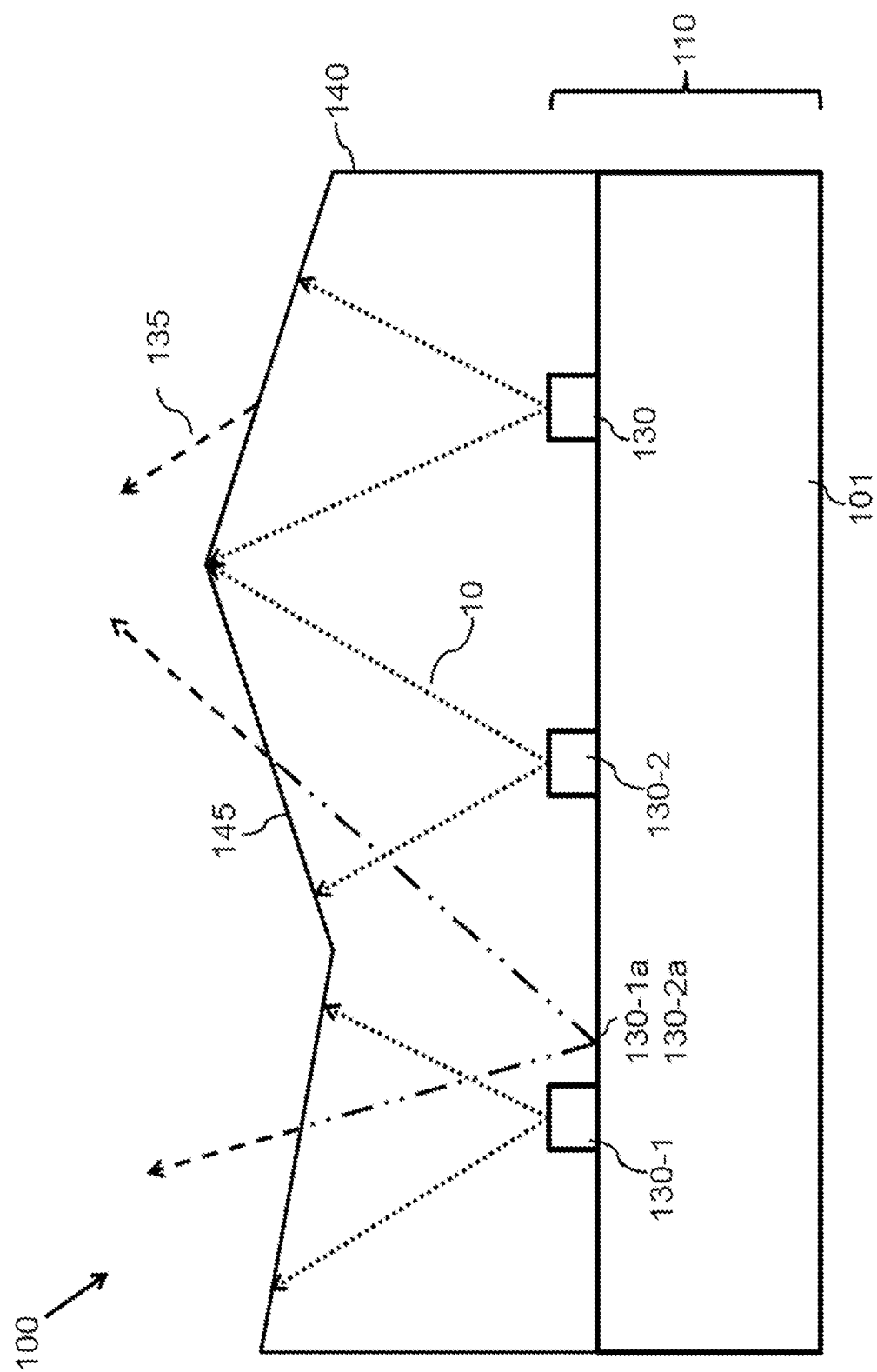
FIG. 3 shows a principal sketch of a cross-section of a third laser arrangement.

FIG. 3 shows a principal sketch of a cross-section of a third laser arrangement 100. The third laser arrangement 100 comprise again a laser array 110 comprising a multitude of lasers 130 (e.g. VCSELs) which are arranged in a regular hexagonal pattern in the plane of the laser array 110. The optical device 140 consists of a transparent material which is provided on wafer level on the same side of the substrate 101 on which the VCSELs are processed. The transparent (e.g. polymer) material is subsequently processed by means of a lithographic process to get the localized optical structures 145. The localized optical structures 145 are in this case prismatic surfaces similar as discussed with respect to FIG. 1. The essential difference between the embodiment discussed with respect to FIG. 1 and the third laser arrangement 100 is that the optical device 140 refracts the beams of two (or more) different VCSELs such that they appear to come from the same apparent position or spot. Laser light 110 emitted by the first laser 130-1 appears to be emitted from the apparent position of the first laser 130-1a. Laser light emitted by the second laser 130-2 appears to be emitted from the apparent position of the second laser 130-2a which coincides with the apparent position of the first laser 130-1a. The position of these spots or apparent positions are again randomized in lateral dimensions. The advantage is a redundancy and a significant reduction of single pixel failure rate.

Figure 4:
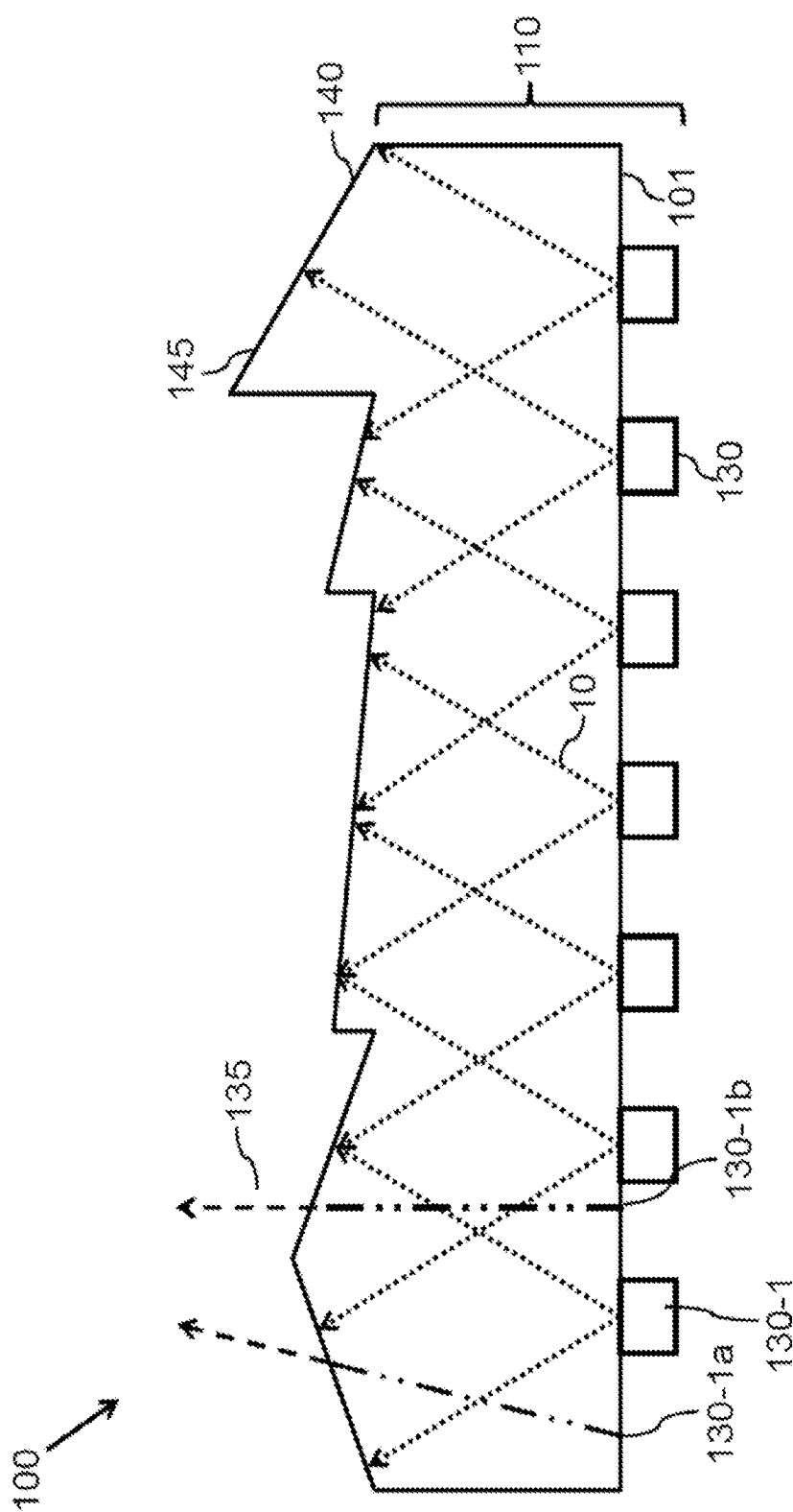
FIG. 4 shows a principal sketch of a cross-section of a fourth laser arrangement.

FIG. 4 shows a principal sketch of a cross-section of a fourth laser arrangement 100. The fourth laser arrangement 110 comprises an array of lasers 130 (VCSEL) which are arranged to emit laser light through the substrate 101 of the VCSEL array 110 (bottom emitter). The optical device 140 is according to this alternative embodiment integrated in the side of the semiconductor substrate 101 which is opposite to the side on which the VCSELs are processed. The side of the semiconductor substrate 101 comprising the optical device 140 is etched such that localized optical structures 145 are provided. The localized optical structures 145 are in this embodiment again inclined surfaces. For a typical VCSEL array with 40 μm pitch a maximum tilt of the localized optical structure 145 (emission facet) on the substrate side of about 3° is sufficient to shift the apparent source position by half the pitch of the lasers. These small angles are easy to produce and also easy to coat with an anti-reflex coating. The VCSELs are arranged such that the laser light 10 of neighboring VCSELs in the laser array 110 overlap in a plane of the localized optical structures. The first laser 130-1 emits, for example, laser light 10 such that two different inclined surfaces receive laser light from the first laser 130-1. One part of the laser light 10 appears therefore to be emitted from a first apparent position of the first laser 130-1a wherein another part of the laser light emitted by the first laser 130-1 appears to be emitted from a second apparent position of the first laser 130-1b. This approach enables generation of a relatively dense pattern of redirected laser light 135 by means of a relatively small laser array 110.

Figure 5:
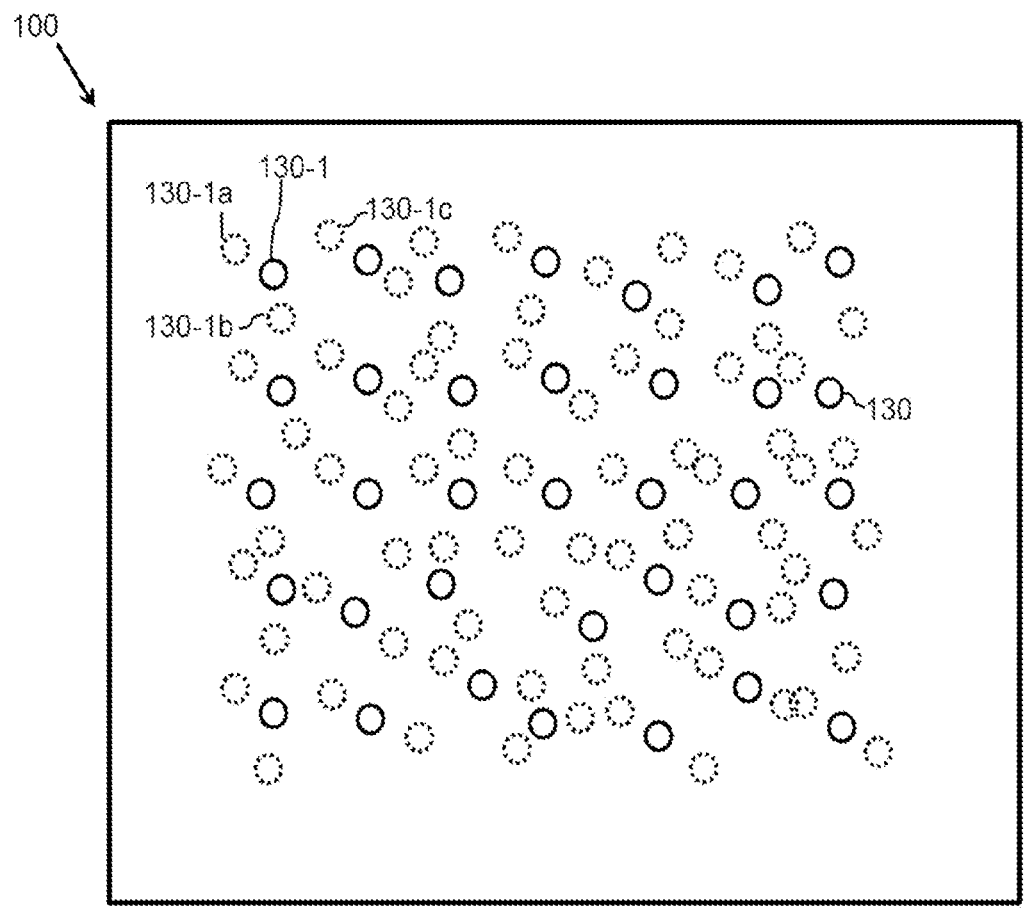
FIG. 5 shows a principal sketch of a top view of a fifth laser arrangement.

FIG. 5 shows a principal sketch of a top view of a fifth laser arrangement 100. The fifth laser arrangement 100 comprises a two dimensional laser array 110 with a multitude of lasers 130 which are arranged in an irregular (random or pseudo-random) pattern. The optical device 140 is arranged similar as described with respect to FIG. 3. The difference is that at least some of the lasers 130 emit laser light 10 to more than one different localized optical structures 145 such that some of the lasers 130 seem to emit laser light from more than one apparent positions. The first laser 130-1 seems to emit, for example, laser light from three different apparent positions 130-1a, 130-1b, 130-1c.

This arrangement has the effect that a small shift in, for example, the x-direction in the plane of FIG. 5 between the laser array 110 and the optical device 140 would result in a total different pattern in the field of view. One laser array 110 with randomly distributed lasers 130 enables in combination with one optical structure 140 a multitude of different illumination patterns in the field of view.

Figure 6:
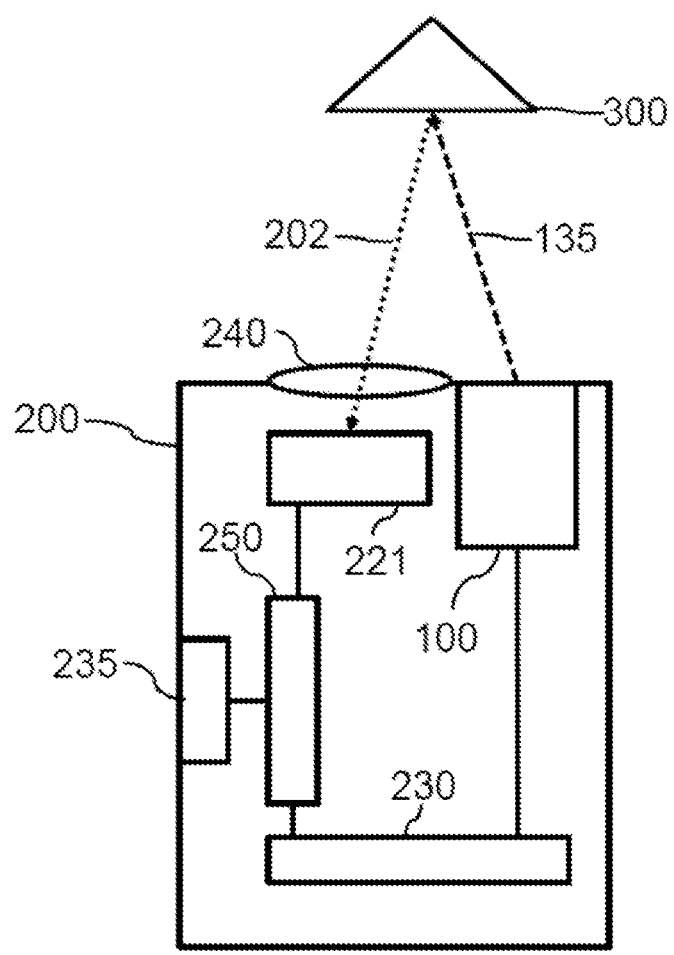
FIG. 6 shows a principal sketch of a camera.

FIG. 6 shows a principal sketch of a camera 200. The camera 200 comprises a laser arrangement 100 in accordance with anyone of the embodiments discussed above. The camera 200 further comprises a light detector 221 (e.g. CCD chip) which is arranged to detect an illumination pattern of redirected laser light 135 which is reflected by an object 300. Reflected laser light 202 is received by an optical device 240 (e.g. lens or lens arrangement) which images the received laser light to detector 221. The reflected laser light 202 causes a corresponding electrical signal in the detector 221. An electrical driver 230 may be arranged to electrically drive the laser array 120 or optionally each laser 130 or sub-groups of lasers 130 of the laser arrangement 100 separately. A controller 250 is connected with the electrical driver 230 in order to control, for example, start and stop time of the laser light 10 emitted by VCSEL array 110 and/or switching sequence. The controller 250 is further connected with the detector 221 in order to receive electrical signals caused by the reflected laser light 202 detected by detector 221. The camera 200 further comprises an optional interface 235 to transfer data which is generated by means of the controller 250 based on the received electrical signals. The transferred data may be used to determine a three dimensional shape of the object 300 based on the pattern detected by means of the light detector 221 in combination with a known pattern of redirected laser light 135 emitted by the laser arrangement 100. The detected pattern may further be used to determine a distance between the camera 200 and the object 300. The camera 200 may alternatively comprise an evaluator (not shown) electrically connected with the controller 250 (or may comprise or be comprised by controller 250) in order to determine the three dimensional shape of the object 300.

Figure 7:
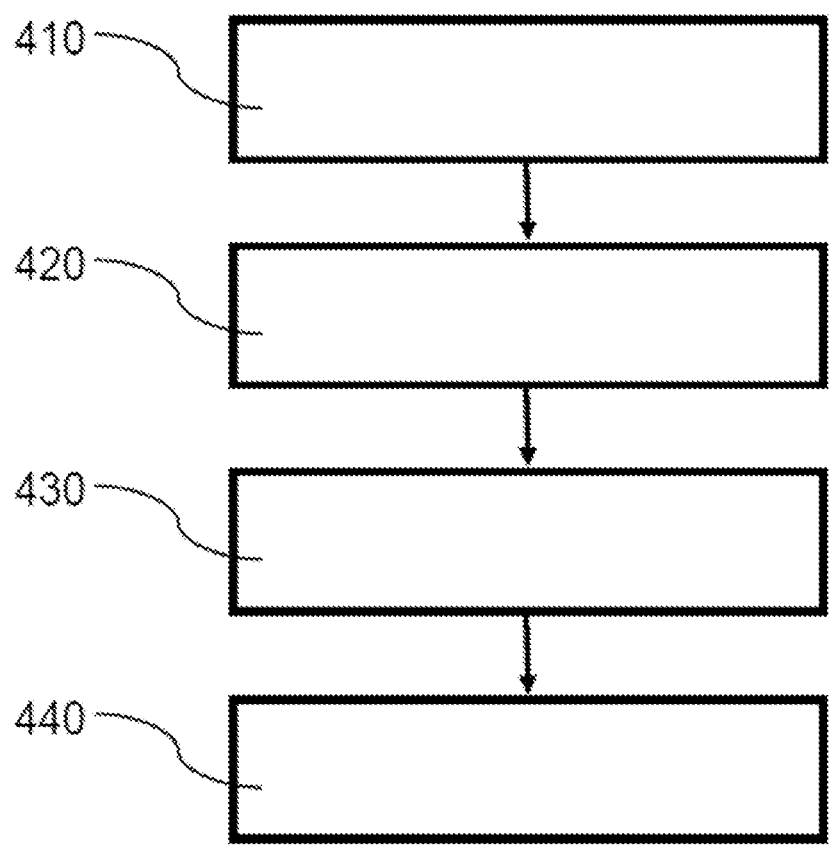
FIG. 7 shows a principal sketch of a process flow of a method of fabricating a laser arrangement.

FIG. 7 shows a principal sketch of a process flow of a method of fabricating a laser arrangement 100. In step 410 is a laser array 110 provided. The laser array 110 comprises a multitude of lasers 130. An optical device 140 is provided in step 420. The optical device 140 comprises a multitude of localized optical structures 145 arranged in a plane of the optical device 140. Each localized optical structure 145 is associated in step 430 with at least one laser 130. The localized optical structures are in step 440 finally arranged to redirect laser light 10 emitted by the lasers 130 such that the laser light 10 emitted by each laser 130 appears to be emitted from at least one apparent position 130-1a, 130-1b of the laser array 110, and wherein the at least one apparent positions 130-1a, 130-1b are distributed in an irregular pattern.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 laser light
100 laser arrangement
110 laser (e.g. VCSEL) array
101 semiconductor substrate
130 laser (e.g. VCSEL)
130-1 first laser
130-1a first apparent position of first laser
130-1b second apparent position of first laser
130-1c third apparent position of first laser
130-2 second laser
130-2a first apparent position of second laser
130-3 third laser
130-3a first apparent position of third laser
135 redirected laser light
140 optical device
145 localized optical structure
200 camera
202 reflected laser light
221 light detector
230 electrical driver
235 interface
240 optical device
250 controller
300 object
410 step of providing laser array
420 step of providing optical device
430 to step of associating localized optical structures
440 step of arranging optical device

What is claimed is:

1. A laser arrangement, comprising:
a laser array including a multitude of lasers; and
an optical device configured to provide a defined illumination pattern in a defined field-of-view, the optical device including a multitude of localized optical structures, each respective localized optical structure being associated with at least one respective laser of the laser array and being arranged to redirect laser light emitted by the at least one respective laser such that laser light emitted by the at least one respective laser appears to be emitted from at least one apparent position of the laser array,
wherein the localized optical structures are arranged such that laser light emitted by at least one respective selected laser appears to be laser light emitted from at least two respective point sources located at different apparent positions of the laser array, and
wherein the optical device is arranged such that the apparent positions are distributed in an irregular pattern.

2. The laser arrangement according to claim 1, wherein the multitude of lasers are arranged in an irregular pattern.

3. The laser arrangement according to claim 1, wherein at least a part of the multitude of lasers are associated with at least two respective localized optical structures.

4. The laser arrangement according to claim 1, wherein each respective localized optical structure is associated with exactly one laser.

5. The laser arrangement according to claim 1, wherein the optical device is arranged such that apparent positions of different lasers overlap.

6. The laser arrangement according to claim 1, wherein the multitude of lasers are Vertical Cavity Surface Emitting Lasers (VCSELs) arranged on a common semiconductor substrate comprising a first side and a second side opposite to the first side, wherein the VCSELs are arranged on the first side of the semiconductor substrate.

7. The laser arrangement according to claim 1, wherein the optical device is a refractive optical device, and wherein the localized optical structures are refractive optical structures.

8. The laser arrangement according to claim 7, wherein the refractive optical structures are surfaces which are inclined with respect to a plane comprising light emission surfaces of the multitude of lasers, and wherein the inclined surfaces are arranged to redirect the laser light emitted by different lasers in different directions.

9. The laser arrangement according to claim 1, wherein the optical device is a diffractive optical device, and wherein the localized optical structures are diffractive optical structures.

10. The laser arrangement according to claim 9, wherein the diffractive optical structures comprise local grating structures, and wherein the local grating structures are arranged to redirect laser light emitted by different lasers in different directions.

11. A light emitting device comprising:
at least one laser arrangement according to claim 1; and
an electrical driver configured to provide an electrical drive current to the laser arrangement.

12. An optical key comprising the light emitting device according to claim 11.

13. The optical key according to claim 12, wherein the laser array comprises laser sub-arrays, wherein the laser sub-arrays are configured to be electrically driven independently by means of the electrical driver, and wherein the electrically driver is arranged to switch the laser sub-arrays on and off in accordance with a predefined switching sequence.

14. A camera comprising:
the light emitting device according to claim 11,
an evaluator; and
a light detector,
wherein the light detector is arranged to detect laser light reflected by an object, and
wherein the evaluator is arranged to determine a distance to the object via the reflected laser light detected by the light detector.

15. A method of fabricating a laser arrangement, the method comprising:
providing a laser array comprising a multitude of lasers,
providing an optical device, wherein the optical device comprises a multitude of localized optical structures,
associating each localized optical structure with at least one laser,
arranging the localized optical structures to redirect laser light emitted by the multitude of lasers such that laser light emitted by each respective laser appears to be emitted from at least one apparent position of the laser array, and
further arranging the localized optical structures such that the laser light emitted by at least one of the multitude of lasers appears to be laser light emitted from at least two respective point sources located at different apparent positions of the laser array,
wherein the apparent positions are distributed in an irregular pattern.

16. A laser arrangement, comprising:
a laser array including a multitude of lasers; and
an optical device configured to provide a defined illumination pattern in a defined field-of-view, the optical device including a multitude of localized optical structures, each respective localized optical structure being associated with at least one respective laser of the laser array and being arranged to redirect laser light emitted by the at least one respective laser such that laser light emitted by the at least one respective laser appears to be emitted from at least one apparent position of the laser array,
wherein the localized optical structures are arranged such that laser light emitted by at least one respective selected laser appears to be emitted from at least two apparent positions of the laser array,
wherein the optical device is arranged such that the apparent positions are distributed in an irregular pattern,
wherein the optical device is a refractive optical device, and wherein the localized optical structures are refractive optical structures,
wherein the refractive optical structures are surfaces which are inclined with respect to a plane comprising light emission surfaces of the multitude of lasers,
wherein the inclined surfaces are arranged to redirect the laser light emitted by different lasers in different directions, and
wherein tilt angles of the inclined surfaces are distributed in an irregular pattern.

* * * * *